United States Patent
Dunk et al.

[11] Patent Number: 5,475,371
[45] Date of Patent: Dec. 12, 1995

[54] FAULTED CIRCUIT DETECTOR HAVING ISOLATED INDICATOR

[75] Inventors: Michael P. Dunk, Racine; Gary D. Rector, Muskego; John F. Banting, Waukesha, all of Wis.

[73] Assignee: Cooper Industries, Inc., Ohio

[21] Appl. No.: 958,323

[22] PCT Filed: Jun. 21, 1991

[86] PCT No.: PCT/US91/04413

§ 371 Date: Dec. 18, 1992

§ 102(e) Date: Dec. 18, 1992

[87] PCT Pub. No.: WO92/00580

PCT Pub. Date: Jan. 9, 1992

Related U.S. Application Data

[63] Continuation-in-part of Ser. No. 543,223, Jun. 25, 1990, Pat. No. 5,159,319.

[51] Int. Cl.⁶ .................................................. G08B 21/00
[52] U.S. Cl. ............................ 340/660; 340/646; 340/654; 340/664; 324/522; 324/555; 361/88; 361/93
[58] Field of Search .................................. 340/664, 654, 340/646, 641, 660, 663, 662; 324/133, 127, 508, 522, 555, 547; 361/92, 93, 88, 35

[56] References Cited

U.S. PATENT DOCUMENTS

| | | | |
|---|---|---|---|
| 3,700,967 | 10/1972 | Ross | 317/18 D |
| 3,720,872 | 3/1973 | Russell et al. | 324/133 |
| 4,000,462 | 12/1976 | Boyd et al. | 324/127 |
| 4,037,155 | 7/1977 | Ahmed | 324/133 |
| 4,045,726 | 8/1977 | Schweitzer, Jr. | 324/51 |
| 4,165,528 | 8/1979 | Schweitzer, Jr. | 361/156 |
| 4,288,743 | 9/1981 | Schweitzer | 324/127 |
| 4,456,873 | 6/1984 | Schweitzer, Jr. | 324/51 |
| 4,558,310 | 12/1985 | McAllise | 340/661 |
| 4,593,276 | 6/1986 | Aida et al. | 340/664 |
| 4,630,218 | 12/1986 | Hurley | 364/481 |
| 4,686,518 | 8/1987 | Schweitzer, Jr. | 340/664 |
| 4,739,149 | 4/1988 | Nishiwaki et al. | 219/130 |
| 4,795,982 | 1/1989 | Schweitzer, Jr. | 324/508 |
| 4,801,937 | 1/1989 | Fernandes | 340/870 |
| 4,847,780 | 7/1989 | Gilker et al. | 364/483 |
| 4,881,028 | 11/1989 | Bright | 324/127 |
| 5,029,039 | 7/1991 | Yeh | 361/59 |
| 5,095,274 | 3/1992 | Brokaw | 340/641 X |
| 5,159,319 | 10/1992 | Dunk et al. | 304/646 |

FOREIGN PATENT DOCUMENTS

| 1439977 | 4/1966 | France . |
|---|---|---|
| 970574 | 10/1958 | Germany . |

*Primary Examiner*—John K. Peng
*Assistant Examiner*—Edward Lefkowitz
*Attorney, Agent, or Firm*—Conley, Rose & Tayon

[57] ABSTRACT

A faulted circuit detector having an electrically isolated and remotely positioned indicator detects fault currents in a monitored conductor. When a fault of a predetermined magnitude is detected, a light pulse is transmitted from the detector to the indicator via a fiber optic cable where, upon receipt, the pulse is converted to an electrical pulse causing the indicator to indicate a "fault" state. A reset circuit within the indicator resets the indicator at regular intervals to the "normal" state as long as a predetermined minimum voltage is present on the monitored conductor. The detector includes a temperature compensation circuit and low pass filter circuit so as to prevent misoperation due to varying ambient temperatures or high frequency transients. A test circuit is also provided to allow service personnel to field-test the device with the monitored conductor in an energized state.

14 Claims, 3 Drawing Sheets

FAULTED CIRCUIT DETECTOR HAVING ISOLATED INDICATOR

This application is a continuation-in-part of Ser. No. 543,223 filed Jun. 25, 1990, now issued as U.S. Pat. No. 5,159,319.

BACKGROUND OF INVENTION

The present invention relates generally to fault sensors and indicators for electrical distribution systems. More particularly, the invention relates to self-resetting fault indicators, wherein after the occurrence of a fault on a monitored line, the indicator is reset to display a "normal" indication in instances where the fault or system disturbance was of a transient nature. Still more particularly, the invention relates to a fault detector having a self-resetting fault indicator that is electrically isolated from the sensor assembly and in communication with the sensor via a fiber optic link.

Fault detectors of various types have been employed for detecting faults in electrical power distribution systems and for providing a visual indication that such a fault has been detected. Such detectors typically include a sensor and an indicator. The sensor is usually connected to a load carrying conductor for detecting the presence of a fault or system disturbance in the monitored conductor and for signalling the indicator of such an event. The sensor typically includes a clamp-on device which clamps directly over the conductor that is to be monitored. Other prior art sensors have been mounted on test points provided on connectors or components of the distribution system. The indicator is electrically connected to the sensor and is often mounted remotely from the sensor so as to provide a more convenient observation point for workmen. Upon receipt of a signal that a fault of a predetermined magnitude has occurred, the indicator displays a visual indication that a fault or disturbance has been detected in the monitored line.

Fault detectors are typically installed on each phase of the various branches of an electrical distribution circuit so as to provide information for repair crews who must find and repair faulted circuits when they occur. Without fault indicators, the repair crews must operate on a trial and error basis in order to find the faulted branch circuit. This may be done by disconnecting the individual branch circuits, one at a time, from their common feeder circuit, and then closing the feeder circuit breaker that supplies the network of branch circuits so as to determine if the isolated or disconnected branch was the one in which the fault occurred. If the fault still exists on the system, electrical relays or other protective devices will automatically cause the feeder circuit breaker to "trip," thereby again opening the feeder circuit. This will indicate to the repair crew that the fault was not on the disconnected branch, but instead is on one of the branch circuits still connected to the feeder circuit. This trial and error approach to finding the faulted circuit is eliminated through the use of faulted circuit indicators, as the repair crews need only visually inspect the indicators and locate the line or lines having indicators displaying a "fault" indication.

On lines having faulted circuit detectors, after the malfunction or fault has been located and repaired, the indicators must be reset from their "fault" to their "normal" indication state. Many prior art indicators had to be manually reset using a nonconductive tool known in the art as a "hot stick". other fault detectors have included means for automatically resetting the indicator to a "normal" state once the normal or steady-state load current has existed for a predetermined length of time.

Self-resetting fault detectors typically employ a mechanical flag or other visual display device, a trip circuit for causing the display device to indicate a fault upon the occurrence of a current of a predetermined magnitude in the monitored conductor, and a periodically-actuated reset circuit for causing the display device to move to its reset or "normal" state upon the reoccurrence of normal steady-state load current in the monitored conductor.

Because the sensors are often mounted in relatively inaccessible locations, it is often desirable that the indicator be located remotely from the sensor so as to provide repair crews a better vantage point from which to visually check the indicator. In these instances, the sensor and indicator portions of the faulted circuit detector have typically been connected by an electrical conductor or conductors. In a typical application, such sensors are mounted on the primary or high voltage side of a distribution transformer, while the indicator is positioned remotely, on the low voltage or secondary side. Having the sensor and remote indicator connected by an electrical conductor presents the undesirable situation that the conductor's insulation could break down and cause a fault to ground or to another phase. The previous methods used to isolate the high voltage side sensor from the low voltage side indicator have included the use of a conductor formed of a carbon impregnated material. Such a conductor has an extremely high impedance, and thus imposes significant limitations on the functionability of the indicator. Further, the wire is nevertheless a conductor of electric current, and may still provide a current path to ground or to the secondary voltages.

Present-day fault detectors have additional disadvantages and sometimes prove unreliable, such as by falsely indicating the presence of a fault or failing to indicate that a fault has occurred. Such misoperation may be caused, for example, by the presence of high frequency transients on the circuit that is being monitored by the detector. Such transients are typically caused by switching events occurring elsewhere on the electrical system. Misoperation of the detector may also occur because the sensors employed in many present-day detectors are affected to a great degree by changes in temperature and because the detectors are typically installed in outdoor locations where they are subjected to a wide range of ambient temperatures.

Thus, although there presently exists apparatus for detecting and indicating the presence of faults on power system circuits, it should be apparent that such apparatus may be improved both to enhance the degree of isolation between the sensor assembly and the indicator, and to enhance the operational reliability of the faulted circuit detector.

SUMMARY OF THE INVENTION

Accordingly, there is provided herein an apparatus for sensing an overcurrent or fault condition in a monitored electrical conductor and providing a visual indication of such condition at a remotely located, electrically isolated indicator. The apparatus of the present invention generally comprises a sensor for detecting a fault condition in the monitored conductor and an indicator for providing a visual indication that a fault has occurred. The invention further includes a communication path between the sensor and indicator, such path comprising an electrical insulator, such as a fiber optic cable, such that the sensor and indicator are electrically isolated from one another so as to prevent fault currents from being transmitted therebetween. Also provided is an automatic means for resetting the indicator to its normal or nonfault indication state as long as a predetermined minimum voltage is present on the monitored electrical conductor.

The sensor may include a transmitter circuit comprising a light emitting diode (LED) adapted for transmitting a light pulse through the fiber optic cable when current is permitted to flow through the LED, and a silicon unilateral switch which closes, thereby allowing current to flow to the LED, when a predetermined voltage is present across the switch. The sensor's transmitter circuit may further comprise a programmable resistor for causing the predetermined voltage to appear across the silicon unilateral switch when a fault current of a predetermined magnitude has been sensed in the monitored conductor. To prevent high frequency transients from causing the transmitter circuit to falsely signal the indicator that a fault has been detected, the sensor may include a low pass filter for excluding those transients that have a high enough magnitude to otherwise cause the transmitter circuit to operate. Additionally, the sensor may include a temperature compensation circuit designed to minimize the effect that temperature change might otherwise have on the sensor output, thereby increasing the accuracy and reliability of the invention.

The automatic reset means in the present invention may include a detector circuit for determining when the predetermined minimum voltage is present on the monitored conductor, a reset circuit for continuously resetting the indicator at periodic intervals as long as the minimum voltage is detected, and a holdoff circuit for deactivating the reset circuit when the predetermined minimum voltage is not detected on the monitored conductor. The indicator may further include a fiber optic detector for receiving the light pulse transmitted through the fiber optic cable and converting the pulse to an electrical pulse. The indicator may also comprise a timer, such as a dual CMOS timer package, which receives the electrical pulse from the fiber optic detector and transmits an output pulse to cause the indicator to change from a "normal" to a "fault" indication state, and to cause the holdoff circuit to delay the reset circuit a predetermined period of time before resetting the indicator.

The apparatus may further include a test circuit for testing the apparatus and causing the indicator to indicate the presence of the overcurrent condition when such a condition does not actually exist on the monitored conductor. Such a test circuit may comprise a magnetically operable switch positioned in the sensor which can be actuated by manually positioning a magnet in close proximity to the sensor, thereby allowing maintenance or service personnel to safely check the operation of the apparatus while the monitored conductor remains in its "energized" or load-carrying state.

Thus, the present invention comprises a combination of features and advantages which enable it to substantially advance the fault detector technology by providing a self-resetting indicator that is electrically isolated from the fault sensing apparatus and which can be field tested without removing the monitored conductor from service. The invention also includes circuitry in the sensor assembly which serves to insure reliability and accuracy by preventing high frequency transients and varying ambient temperatures from causing misoperation of the fault detector. These and various other characteristics and advantages of the present invention will be readily apparent to those skilled in the art upon reading the following detailed description and referring to the accompanying drawings.

BRIEF DESCRIPTION OF THE DRAWINGS

For an introduction to the detailed description of the preferred embodiment of the invention, reference will now be made to the accompanying drawings, wherein.

DESCRIPTION OF THE PREFERRED EMBODIMENT

Figure 1:
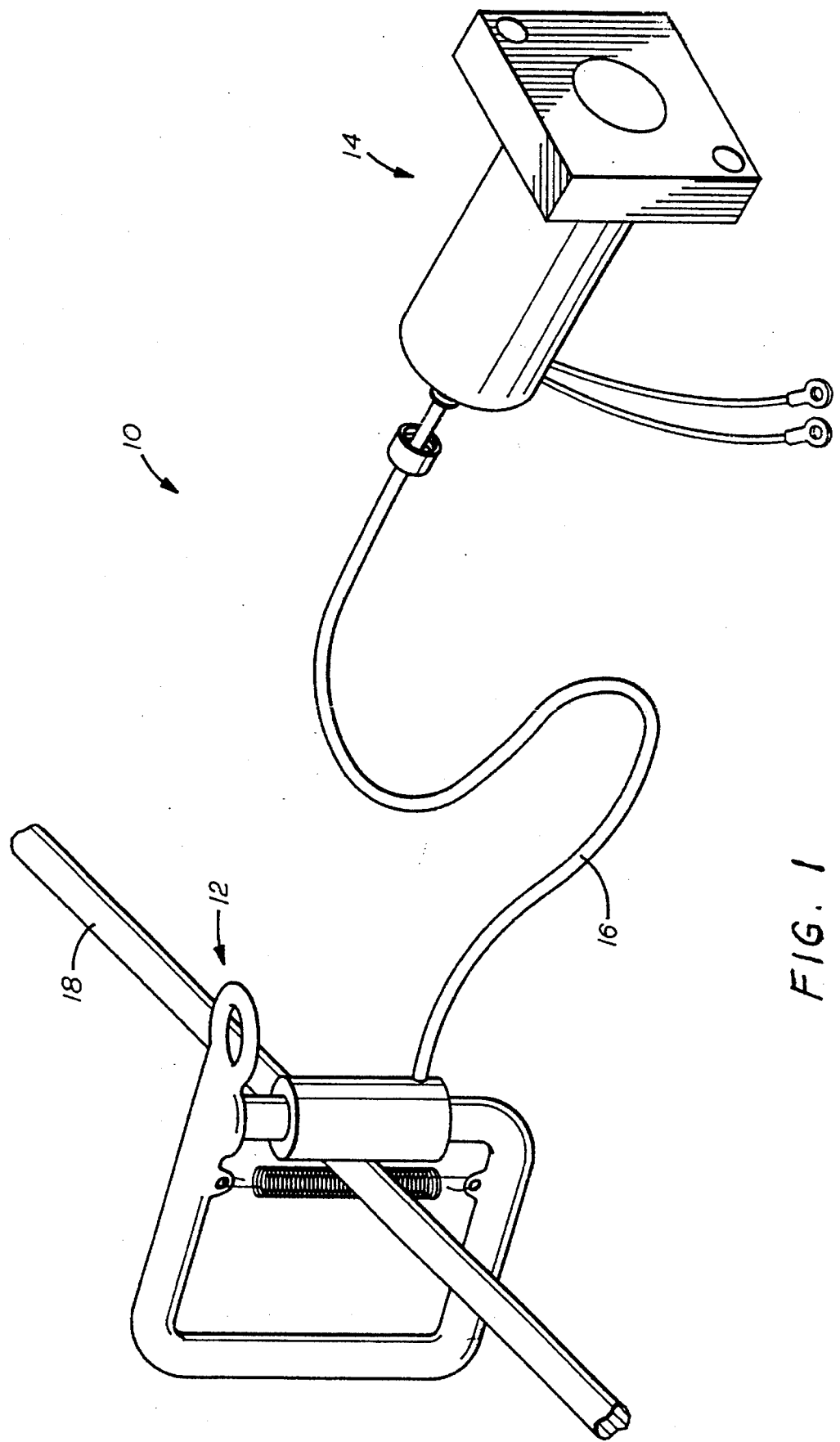
FIG. 1 shows a perspective view of the faulted circuit detector of the present invention.

Referring initially to FIG. 1, there is shown one example of a faulted circuit detector 10 structured in accordance with the principals of the present invention. Detector 10 generally comprises a sensor assembly 12 and an indicator assembly 14. In the example of the preferred embodiment shown, sensor assembly 12 is disposed about a load-carrying monitored conductor 18 which is to be monitored for fault currents. Indicator assembly 14 is positioned remotely from sensor assembly 12 and is in communication therewith by means of fiber optic cable 16.

Sensor Assembly

Figure 2:
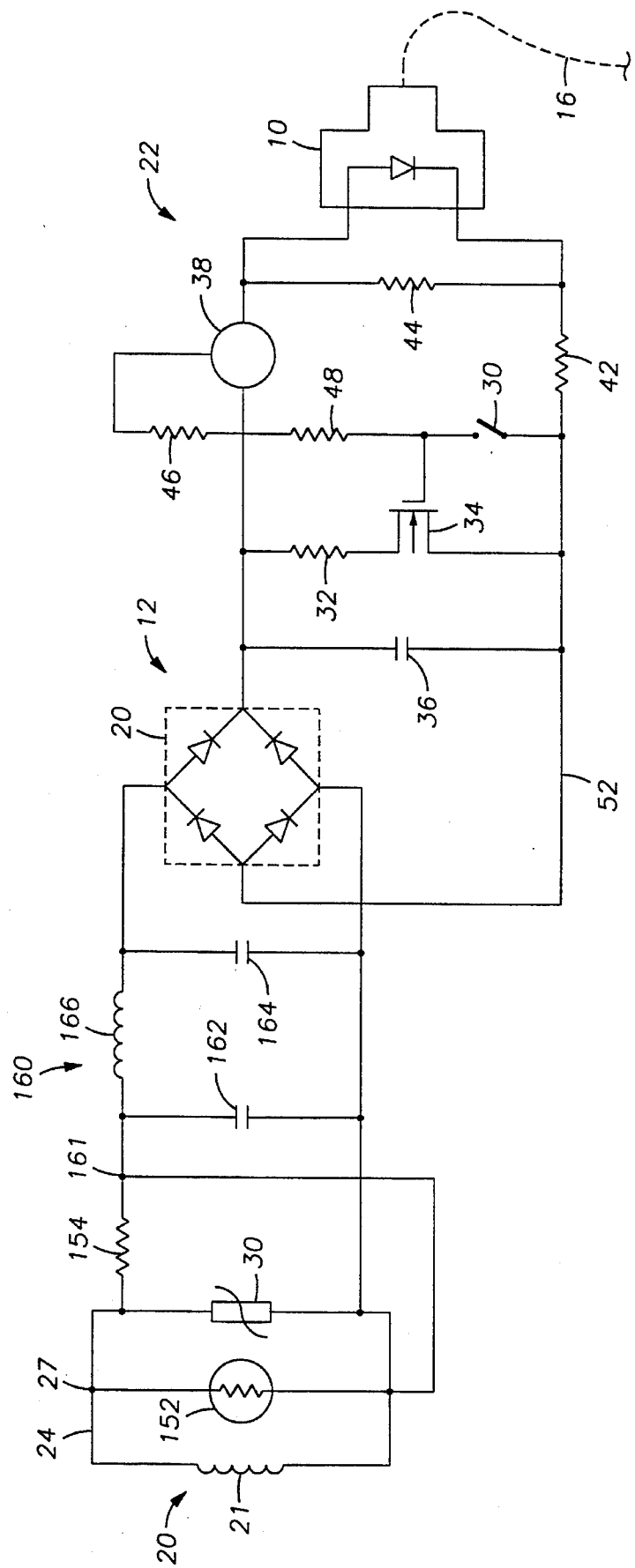
FIG. 2 shows a schematic diagram of the sensor assembly of the detector shown in FIG. 1.

Referring now to FIG. 2, there is shown a schematic diagram of the circuit for the sensor assembly 12 shown in FIG. 1. In general, sensor assembly 12 includes a current transformer 20 for sensing the current levels in conductor 18 (FIG. 1), and a transmitter circuit 22 for transmitting a light pulse to indicator assembly 14 when a predetermined current level is sensed in the monitored conductor 18. For improved reliability and accuracy, sensor assembly 12 further includes a temperature compensation circuit 150 for negating the adverse effects that temperature changes can have on the operation of current transformer 20, and a low pass filter 160 for filtering out undesirable high frequency transients which would otherwise be passed to transmitter circuit 22, possibly causing a false indication of a fault condition.

As shown in FIG. 2, current transformer 20 comprises a wire coil 21 having output leads 24, 26. When leads 24 and 26 are connected to a load, a current proportional to the current flowing in monitored conductor 18 is induced in coil 21 and communicated to the load via leads 24, 26. In the preferred embodiment, coil 21 is comprised of copper wire. A suitable current transformer 20 for the present invention includes a coil 21 consisting of 7,000 turns of No. 41 gauge copper wire wound on a plastic bobbin core. The nominal direct current resistance (DCR) measured across coil 21 is 1,370 ohms ±15%.

The DCR of copper wire will change as its temperature changes. More specifically, as the temperature of the wire increases, the DCR will also increase in a linear fashion. A material which exhibits this property is said to have a positive temperature coefficient (PTC). Thus, without any temperature compensation means, as the temperature of coil 21 increases in response to an increase in ambient temperature, the resistance of coil 21 also increases, thus causing a disproportionally smaller current than the current flowing in monitored conductor 18 to pass to transmitter circuit 22. This situation could cause misoperation of the detector.

Accordingly, the sensor assembly 12 includes temperature compensation circuit 150 which generally includes a thermistor 152 and a resistor 154. As shown in FIG. 2, thermistor 152 is wired electrically in parallel with resistor 154. One end of this parallel combination is electrically connected to lead 24 of current transformer 20 at connection 27 while the other end is tied to low pass filter 160 at connection 161.

Thermistors may have either positive or negative temperature coefficients. In this application, thermistor 152 has a negative temperature coefficient (NTC) which means that its resistance will decrease as its temperature increases. A thermistor found suitable for this application is manufactured by Fenwal Electronics, Inc., Model No. 197-102DAG-A01, and has a resistance of 1,000 ohms at 25° C. ±10% and has a resistance ratio of 6.35. The resistance ratio of a thermistor is the ratio of its change in resistance to the change in temperature experienced by the thermistor. To ensure that thermistor 152 is exposed to the same temperature as coil 21, thermistor 152 is physically placed directly on top of, and tape-wrapped to, coil 21.

In the preferred embodiment as shown in FIG. 2, resistor 154 is rated 825 ohms, ¼ W, 1% tolerance. Resistor 154 is selected to have a negligible resistance change over the predetermined operating range of temperatures, such temperature range being approximately −40° C. to +85° C. By connecting resistor 154, which is substantially unaffected by temperature changes, in parallel with thermistor 152, which has a negative temperature coefficient, the resistance of the parallel combination of thermistor 152 and resistor 154 will decrease with increased temperatures. In this manner, thermistor 152, resistor 154 and coil 21 are selected based upon their resistances and temperature coefficients so that, with changes in temperature, the resulting change in resistance of coil 21 will be negated by an opposite and proportional change in the resistance of the parallel combination of thermistor 152 and resistor 154. Thus, irrespective of any temperature change within the prescribed range, the voltage appearing across capacitor 162 of the low pass filter 160 will remain nearly constant for a given current in monitored conductor 18. This result provides a consistent output to the transmitter circuit 22 over a wide temperature range, thereby insuring greater accuracy and reliability in fault indicator performance.

Referring still to FIG. 2, low pass filter 160 generally comprises capacitors 162, 164 and inductor 166. As described above, the output from temperature compensation circuit 150 is connected across capacitor 162. Low pass filter 160 is employed to filter or remove high frequency transients from the signal communicated to it by temperature compensation circuit 150. Such transients, which may be caused by a variety of switching events or lightning strikes, for example, typically cause high magnitude currents to flow in monitored conductor 18, which in turn induces a corresponding high magnitude current in coil 21 of current transformer 20. This current, if allowed to pass to transmitter circuit 22, could cause the detector 10 to falsely indicate the presence of a fault. The low pass filter 160 is included to distinguish between transient events such as these and a fault-induced overcurrent so as to ensure proper operation of the faulted circuit detector 10. Capacitors 162, 164 and inductor 166 of the low pass filter circuit 160 are selected to allow only a narrow range of frequencies to flow through the low pass filter 160 to transmitter circuit 22. The band of frequencies that low pass filter 160 is designed to pass is centered about the nominal system frequency of the conductor being monitored, i.e., 60 hz in the United States. In the preferred embodiment, the filter's roll off point may be within the range of approximately 1,000–2,000 hz.

After the signal has been conditioned via the low pass filter circuit 160, it passes through a bridge rectifier circuit 28 of transmitter circuit 22. The bridge rectifier circuit 28, which is connected directly to the output of low pass filter circuit 160, rectifies the alternating current to dc for use by the transmitter circuit 22.

Connected across coil 21 of the current transformer 20 is varistor 30 which provides over-voltage protection for the circuitry in sensor assembly 12. If the current induced in coil 21 of current transformer 20 approaches a predetermined level, the voltage appearing across coil 21, varistor 30 and capacitor 162 will reach the breakdown voltage of the varistor (22 volts in the preferred embodiment), at which point the varistor 30 will act as a conductor, shunting coil 21 and preventing damage to the circuitry of sensor assembly 12.

At normal voltages, below the breakdown voltage of varistor 30, current leaving the bridge rectifier 28 is cascaded through the series combination of programming resistor 32 and transistor 34 which provide the load for current transformer 20. Nominally, the voltage across the combination of resistor 32 and transistor 34 is between 0 and 12 volts. Connected in parallel with the series combination of programming resistor 32 and transistor 34 is capacitor 36 which is used for filtering and for energy storage as explained in more detail below.

Also in parallel with the series combination of resistor 32 and transistor 34 is a series combination comprising silicon unilateral switch (SUS) 38, fiber optic transmitter or LED 40 and resistor 42. SUS 38 has the characteristic that as the voltage across it rises, it maintains a high resistance until a predetermined level is reached. At that predetermined voltage, which is equal to 8.2 volts in the preferred embodiment, SUS 38 becomes conductive and turns "on", allowing current to flow therethrough to fiber optic transmitter 40. Resistors 44 and 46 form a voltage divider network that is employed in the circuit 22 to bias the SUS 38 to the proper operating condition.

Resistor 32 is a resistor which is used to adjust the amount of current which will trigger the SUS 38. The SUS 38 will become conductive at 8.2 volts. Thus, the larger resistor 32 is, the less current that is necessary to trigger SUS 38. When SUS 38 becomes conductive, capacitor 36 discharges through SUS 38, fiber optic transmitter 40 and resistor 42. The capacitor 36 preferably stores a relatively small amount of energy, which, when discharged, provides a surge to the transmitter 40. Transmitter 40 thereafter responds by providing a high intensity but short pulse of light through fiber optic cable 16. When the current through SUS 38 drops back toward zero upon discharge of capacitor 36, SUS 38 switches back to its "off" or highly resistive mode, and the voltage is allowed to build up again on capacitor 36 and programming resistor 32. Resistor 42 is provided to limit the discharge current of capacitor 36 through fiber optic transmitter 40 so that transmitter 40 is not damaged by excessive current levels.

In general, the transmitter circuit 22 converts a small amount of current generated by current transformer 20 into a voltage level. When the voltage level exceeds a predetermined value, 8.2 volts in this embodiment, capacitor 36 discharges through SUS 38 and fiber optic transmitter 40 which, in turn, provide a bright, single pulse of light.

The preferred embodiment of transmitter circuit 22 further includes a test circuit comprised of resistor 48, magnetic reed switch 50 and transistor 34. Resistor 48 has a resistance that is larger by approximately an order of magnitude than the resistance of programming resistor 32. Reed switch 50 is positioned within sensor assembly 12 such that when a repairman or operator positions a magnet near the sensor assembly 12, such as by use of a "hot stick" magnetic reed switch 50 closes, thereby turning off transistor 34 and effectively removing resistor 32 from the circuit. Because the resistance of resistor 48 is much larger than the resistance of programming resistor 32, the voltage across resistor 48 rises rapidly. When the threshold voltage of SUS 38 is reached, SUS 38 becomes conductive, triggering fiber optic transmitter 40 to fire a high intensity pulse of light. It will be understood by those skilled in the art that the test circuit comprised of transistor 34, reed switch 50 and resistor 48 could all be deleted from the circuit if it was not desired that the fault detector 10 have the capability of being manually tested. In such a configuration, programming resistor 32 would be tied directly to ground bus 52 rather than being connected to transistor 34. The operation of the transmitter circuit 22 would then be identical to that previously described.

Fiber Optic Transmission Cable

In the preferred embodiment, a fiber optic transmission cable 16 is used as the transmission link between the sensor assembly 12 and indicator assembly 14. Any conventional fiber optic cable can be used, as long as it provides electrical isolation from the adjacent electrical distribution system. Preferably, the cable has a length of approximately six feet to permit the indicator assembly 14 to be strategically located for easy viewing.

Indicator Assembly

Figure 3:
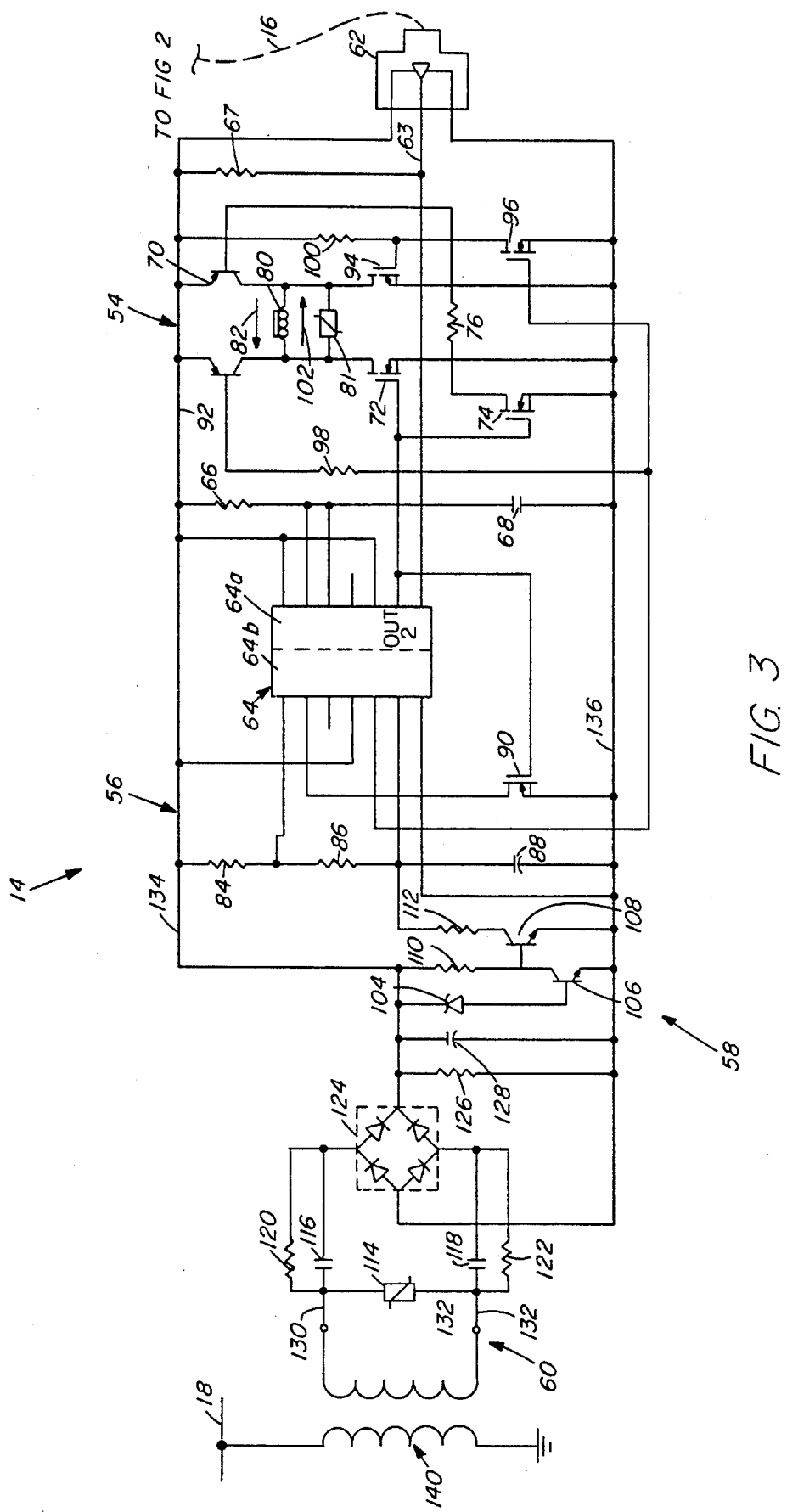
FIG. 3 shows a schematic diagram of the indicator assembly of the detector shown in FIG. 1.

Referring now to FIG. 3, there is shown a schematic diagram of the circuit for the indicator assembly 14, the circuit generally comprising an indication circuit 54, a reset circuit 56, a hold-off circuit 58 and a power supply circuit 60.

Power Supply Circuit

The control or input power for the indicator assembly 14 is supplied from the monitored conductor 18, such as by means of a control power transformer 140 having its primary side connected to conductor 18, such that the transformer's secondary side supplies the input voltage to the indicator assembly 14. In this configuration, the input voltage to the indicator is directly proportional to the voltage on the monitored conductor 18. As shown in FIG. 3, alternating current is supplied from the control power transformer 140 to indicator assembly 14 through leads 130, 132. A varistor 114 is provided and is connected across the input leads to provide over-voltage protection for the indicator assembly 14. Should the voltage across leads 130, 132 exceed a predetermined limit, 150 volts ac in the preferred embodiment, the varistor 114 will become conductive and will shunt the circuits of indicator assembly 14.

The combination of capacitors 116, 118 connected to leads 130, 132 comprise a capacitive current limiter. Resistors 120, 122 are placed in parallel with capacitors 116, 118, respectively, and are used to balance the voltage across the capacitors.

The parallel combination of resistors 120, 122 and capacitors 116, 118 are connected to a rectifying bridge circuit 124 which rectifies the incoming ac signal to dc for use by the indicator assembly circuitry. The current flowing to bridge 124 will be limited by capacitors 116, 118 to approximately 10 to 15 milliamps ac. This current is rectified to dc, and the output from bridge 124 is approximately 12 volts dc. A resistor 126 is placed in parallel with bridge 124 and has a resistance chosen to set the level at which the hold-off circuit 58, described below, will operate. In the preferred embodiment, resistor 126 is selected so that the voltage across it will be 12 volts dc when 60 volts ac is present on the secondary of control power transformer 140. Capacitor 128 is used to filter the output from bridge 124 into a smooth dc signal.

Indication Circuit

Referring still to FIG. 3, the pulse of light generated by the fiber optic transmitter 40 of transmitter circuit 22 (FIG. 2) is transmitted via fiber optic cable 16 to indicator assembly 14, where it is received by fiber optic receiver 62. Receiver 62 is connected between voltage bus 134 and ground bus 136 and converts the light pulse into an electrical pulse of equal duration. The output lead 63 of receiver 62 is connected to an input lead of a dual CMOS timer package 64. The CMOS timer package 64 includes two internal timers, a monostable timer 64a and an astable timer 64b. Monostable timer 64a is employed in the fault indication circuit 54, while the astable timer 64b comprises a component of the reset circuit 56, described in more detail below. In general, timer 64a is employed to "stretch" the short duration light pulse received and converted by receiver 62 into a longer duration electrical pulse. The duration of the electrical pulse output from timer 64a is predetermined by the combination of resistor 66 and capacitor 68. Resistor 67 is employed in the indication circuit 54 to bias the trigger input of timer 64a.

Upon receipt by timer 64a of the short duration input pulse from receiver 62, the output from terminal OUT2 turns on transistors 70, 72 and 74. Resistor 76 is employed as a biasing resistor to set the proper operating voltage for transistor 70. With transistors 70 and 72 turned on, current is allowed to flow to ground bus 136 through these transistors 70 and 72 and through indicator 80, in the direction shown by arrow 82 in FIG. 3. Current flow through indicator 80 in this direction causes indicator 80 to change from the "normal" indication state to the "fault" or "alarm" state. Indicator 80 is a bistable indicator, thus it will continue to display the "fault" indication until being reset. A varistor 81 is connected in parallel with indicator 80 to protect indicator 80 from overvoltages. In the preferred embodiment, varistor 81 will become conductive and shunt the current around indicator 80 when the voltage across indicator 80 exceeds 22 volts.

Reset Circuit

As set forth above, dual CMOS timer package 64 includes a second internal timer 64b that is utilized in reset circuit 56. Generally, reset circuit 56 is composed of timer 64b, resistors 84, 86, capacitor 88 and transistors 90, 92, 94 and 96. The combination of biasing resistors 84 and 86, capacitor 88 and transistor 90 forces the timer 64b to execute a ten second delay period and then issue a reset pulse through its output terminal, thereby turning on transistors 92, 94 and 96. Resistors 98, 100 are included as biasing resistors. Once transistors 92 and 94 are turned on, current will flow through transistors 92 and 94 to ground bus 136, flowing through indicator 80 in the direction shown by arrow 102 in FIG. 3. Current in the direction noted by arrow 102 will cause the indicator 80 to change indications and again display its "normal" indication. Since the indicator 80 is bistable, it will remain in the "normal" or "reset" state after the reset pulse from timer 64b is over. Timer 64b issues the reset pulse every ten seconds so that the reset circuit continuously resets, or attempts to reset, indicator 80 to the "normal" state as long as a predetermined voltage is maintained on the monitored circuit, as determined by the hold-off circuit 58, described below.

Reset circuit 56 cycles continuously as long as the reset is not delayed by the hold-off circuit 58. To preclude the possibility of simultaneous or nearly simultaneous actuation of the indicator 80 by indication circuit 54 and reset circuit 56, and to insure a full 10 second delay always occurs before indicator 80 is reset, the indication circuit 54, upon occurrence of a fault, actuates the indicator 80 while simultaneously actuating the reset circuit 56 by resetting the timer 64b to time zero. More specifically, as stated above, the output from timer 64a initiates the long duration pulse upon receipt of a signal from fiber optic receiver 62. As shown in FIG. 3, the output pulse from terminal OUT2 of timer 64a, which turns on transistor 70, 72 and 74, also turns on transistor 90 which will force the reset timer 64b to start out from time zero. In this manner, the resetting of indicator 80 will always be delayed ten seconds after a "set" pulse is generated by timer 64a.

Hold-Off Circuit

The indicator assembly 14 also includes a hold-off circuit 58 for delaying the reset function if there is insufficient voltage on the monitored conductor 18. As shown in FIG. 3, the voltage available to indicator assembly 14 from the secondary side of control power transformer 140 will be proportional to the voltage on monitored conductor 18. In the preferred embodiment, the reset circuit 56 will be disabled by the hold-off circuit 58 unless at least 87 volts is available to indicator assembly 14. As a result, the fault indicator 80 is reset by reset circuit 56 to indicate a "normal" state if more than 87 volts appears across leads 130 and 132. If less than 87 volts are present, the fault indicator 80 is not reset, but remains on to indicate a "fault" or "alarm" state.

The hold off circuit 58 generally comprises zener diode 104, transistor 106, transistor 108, and resistors 110 and 112. This combination operates to disable the reset function if the incoming ac voltage is less than 87 volts across leads 130, 132. The combination of zener diode 104 and transistor 106 comprise a voltage regulator which limits the voltage on the circuit to approximately 12.7 volts. When that voltage level is reached, the zener diode 104 will break down and current will flow through it to the base of transistor 106, thus turning on transistor 106. Resistor 110 is connected to the collector of transistor 106 and the base of transistor 108 to bias these transistors. When transistor 106 is turned on, transistor 108 switches off. With transistor 108 off, the reset timer 64b is enabled and begins to operate. Accordingly, when there is sufficient voltage across the voltage regulator, comprised of zener diode 104 and transistor 106, transistor 106 turns on, thereby turning off transistor 108, allowing the reset timer 64b to operate again. Conversely, the circuit will hold off or delay the reset operation until there is at least 12.7 volts dc across resistor 126, which corresponds to 87 volts on the incoming leads 130 and 132. Thus, the hold-off circuit prevents the indicator from being reset if there is not at least 87 volts available to indicator assembly 14 from control power transformer 140. The hold-off circuit also prevents low voltages and stray noise from causing a false reset of the indicator.

In the example of the preferred embodiment described above, the following electrical components are suitable for use in the circuitry of the sensor assembly 12 and indicator assembly 14:

| Component | Reference Number | Manufacturer | Description |
|---|---|---|---|
| Bridge | 28, 124 | Diodes, Inc. | 1 amp, 400 v, Mgf's Part No. DB104 |
| Varistor | 30, 81 | Panasonic | ZNR (MOV), 22 v, Mgf's Part No. ERZ-CO5DK220 |
| Programming Resistor | 32 | Mepco/Centralab | ¼ W, 5% |
| Transistor | 34, 72, 74, 90, 94, 96 | Siliconix | FET "N" Channel, Mgf's Part No. 2N7000 |
| Capacitor | 36, 68 | Mepco/Centralab | Cermic, 0.1 uF, 50 v, 20%, Mgf's Part No. CZ20C104M |
| SUS | 38 | Motorola | SUS Transistor, Mgf's Part No. 2N4989 |
| LED | 40 | Motorola | Fiber Optic Emitter, Mgf's Part No. MFOE76 |
| Resistor | 42 | Mepco/Centralab | 33 ohm, ¼ W, 5% |
| Resistor | 44, 86 | Mepco/Centralab | 220 ohm, ¼ W, 5% |
| Reed Switch | 50 | Hamlin | Form A, Mgf's Part No. MDSR-4-185 |
| Receiver | 62 | Motorola | Fiber Optic Detector, Mgf's Part No. MFOD75 |
| Dual CMOS Timer | 64 | Texas Instruments | Mgf's Part No. TLC556IN |
| Resistor | 66 | | 27K, ¼ W, 5% |
| Coil | 21 | Cramer Coil | 7,000 Turns of #41 gauge copper wire |
| Thermistor | 152 | Fenwal | 1,000 Ω at 25° C., Electronics, Inc. resistance ratio 6.35 Mfg.'s Part No. 197-102DAG-A01 |
| Resistor | 154 | Mepco/Centralab | 825 Ω, ¼ W, 1% |
| Capacitors | 162, 164 | Mepco/Centralab | 1 μF, 50 v |
| Inductor | 166 | Nytronics | 10 μH |
| Resistor | 67, 100, 110, 112 | Mepco/Centralab | 10K, ¼ W, 5% |
| Transistor | 70, 92 | Motorola | PNP Transistor, Mgf's Part No. 2N3906 |
| Resistor | 76, 98 | Mepco/Centralab | 470 ohm, ¼ W, 5% |
| Indicator | 80 | Ferranti | Mgf's Part No. 54NR202 |
| Resistor | 84 | Mepco/Centralab | 680K, ¼ W, 5% |
| Capacitor | 88 | Panasonic | Tantalum, 10 uF, 16 v, Mgf's Part No. ECS-FICE106K |
| Zener Diode | 104 | American Power Devices | 12 v, 500 mW, 5% Mgf's Part No. IN5242B |
| Transistor | 106, 108 | Motorola | NPN Transistor, Mgf's Part No. 2N3904 |
| Varistor | 114 | Panasonic | ZNR (MOV), 200 v, Mgf's Part No. ERZ-C05DK201 |
| Capacitor | 116, 118 | Panasonic | Poly. Film, |

-continued

| Component | Reference Number | Manufacturer | Description |
|---|---|---|---|
| | | | 0.47 uF, 250 v, Mgf's Part No. ECQ-E2474KF |
| Resistors | 120, 122 | Mepco/Centralab | 47K, ¼ W, 5% |
| Resistor | 126 | Mepco/Centralab | 18K, ¼ W, 5% |
| Capacitor | 128 | Panasonic | Electrolytic, 470 uF, 16 v, Mgf's Part No. ECE-A1CU471 |

While a preferred embodiment of this invention has been shown and described, modifications thereof can be made by one skilled in the art without departing from the spirit or teaching of the invention. The embodiments described herein are exemplary only and are not limiting. Many variations and modifications of the system and apparatus are possible and are within the scope of the invention. Accordingly, the scope of protection is not limited by the above description, but is only limited by the claims which follow, that scope including all equivalents of the subject matter of the claims.

What is claimed is:

1. An apparatus for detecting the presence of faults on an electrical conductor; comprising:

mean for sensing an overcurrent condition in the electrical conductor, said sensing means comprising a temperature compensation circuit for negating the effect of temperature change on said sensing means;

means remote from said sensing means for indicating the presence of an overcurrent condition in the electrical conductor;

means for communicating the presence of an overcurrent condition sensed by said sensing means to said indicating means;

means for automatically resetting said indicating means;

means for disabling the automatic operation of said resetting means when a predetermined minimum voltage is not present on the electrical conductor; and said temperature compensation circuit comprising a current transformer having a wire coil, said wire coil having a positive temperature coefficient;

a thermistor having a negative temperature coefficient; and a resistor connected in parallel with said thermistor, said resistor having a negligible resistance change at temperatures within the range of approximately −40 degrees C. to +85 degrees C.

2. The apparatus of claim 1 wherein said parallel combination of said resistor and said thermistor is connected electrically in series with said wire coil, and wherein the resistance of the parallel combination decreases in proportion to the increase in resistance of said wire coil when the temperature of said wire coil and said thermistor is increased.

3. Apparatus for detecting a fault on a monitored electrical conductor, comprising:

means for sensing a fault in the conductor, said sensing means including a temperature compensation circuit for negating the effect on said sensing means of temperature changes within the range of approximately −40 degrees C. to +85 degree C., and including a low pass filter circuit for filtering out undesirable high frequency transients induced in said sensing means;

means for remote from said sensing means for indicating the presence of a fault in the electrical conductor;

means for communicating the presence of a fault sensed by said sensing means to said indicating means;

means for automatically resetting said indicating means; and means for disabling automatic operation of said resetting means unless a predetermined minimum voltage is present on the conductor;

said communication means electrically isolating said sensing means from said indicating means;

said resetting means continually resetting said indicating means at regular predetermined intervals unless disabled by said disabling means;

said disabling means comprising a hold-off circuit for deactivating said resetting means when said predetermined voltage is not present on the conductor; and said temperature compensation circuit comprising:

a current transformer having a wire coil, said wire coil having a positive temperature coefficient;

a thermistor having a negative temperature coefficient; and a resistor connected in parallel with said thermistor, said resistor having a negligible resistance change at temperatures within the range of approximately −40 degrees C. to +85 degrees C.

4. Apparatus for indicating that a fault of a predetermined current magnitude has occurred in a monitored electrical conductor on the high voltage side of an electrical distribution transformer, comprising:

a sensor for generating a signal proportional to the current in the monitored conductor;

a low pass filter for filtering high frequency transients in the signal generated by said sensor to prevent the transients from causing misoperation of the apparatus;

an optic transmitter for transmitting a light pulse when a fault condition has been sensed by said sensor;

an optic receiver for receiving said light pulse and transforming said pulse into an electrical pulse;

an indicator for indicating the presence of a fault condition in the monitored conductor upon receipt of said electrical pulse, said indicator having first and second indication states for, respectively, displaying indications of "normal" or "fault" conditions;

a reset circuit for resetting said indicator from the second of said indication states to the first of said indication states; and a hold-off circuit for delaying the reset circuit from resetting said indicator unless a predetermined minimum voltage is present on the low voltage side of the electrical distribution transformer.

5. The apparatus of claim 4 further comprising a temperature compensation circuit for compensating for temperature-induced variations in the signal that is generated by said sensor.

6. The apparatus of claim 5 wherein said optic transmitter comprises:

a light emitting diode adapted for transmitting a pulse of light through a fiber optic cable when current flows through said diode; and a silicon unilateral switch which closes and allows current to flow to said light emitting diode when a predetermined voltage is present across said switch.

7. The apparatus of claim 6 wherein said optic transmitter further comprises a resistor for causing said predetermined voltage to appear across said silicon unilateral switch when a fault of the predetermined current magnitude has been sensed by said sensor.

8. The apparatus of claim 5 further comprising a test circuit for testing said apparatus and causing said optic transmitter to transmit a light pulse to said receiver to indicate the presence of an overcurrent condition in the monitored electrical conductor, said test circuit comprising a manually operable switch in said optic transmitter.

9. The apparatus of claim 4 wherein said low pass filter has a roll-off point within the range of approximately 1,000–2,000 hz.

10. The apparatus of claim 5 wherein said low pass filter has a roll-off point within the range of approximately 1,000–2,000 hz.

11. The apparatus of claim 10 wherein said sensor comprises a wire coil having a positive temperature coefficient and wherein said temperature compensating circuit comprises a thermistor having a negative temperature coefficient.

12. The apparatus of claim 11 wherein:

said temperature compensating circuit further comprises a resistor having a negligible resistance change at temperatures within the range of approximately −40 degrees C. to +85 degrees C. connected in parallel with said thermistor;

wherein said parallel combination of said resistor and said thermistor is connected electrically in series with said wire coil; and wherein the resistance of the parallel combination decreases in proportion to the increase in resistance of said wire coil when the temperature of said wire coil and said thermistor is increased.

13. The apparatus of claim 5 further comprising a timer adapted for receiving the electrical pulse from said optic receiver wherein said timer, upon receipt of the electrical pulse from said optic receiver, transmits an output pulse causing said indicator to change from the first of said indication states to the second of said indication states and causing said reset circuit to delay a predetermined period of time before resetting said indicator.

14. An apparatus for detecting the presence of faults on an electrical conductor, comprising:

a sensor for sensing an overcurrent condition in the electrical conductor, said sensor comprising a temperature compensation circuit for negating the effect of temperature change on said sensing means, said temperature compensation circuit comprising:

a current transformer having a wire coil, said wire coil having a positive temperature coefficient;

a thermistor having a negative temperature coefficient; and a resistor connected in parallel with said thermistor, said resistor having a negligible resistance change at temperatures within the range of approximately −40 degrees C. to +85 degrees C.;

an indicator for indicating the presence of an overcurrent condition in the electrical conductor; and a signal transmitter for communicating the presence of an overcurrent condition sensed by said sensor to said indicator.

* * * * *